US011357101B2

(12) United States Patent
Akre et al.

(10) Patent No.: US 11,357,101 B2
(45) Date of Patent: Jun. 7, 2022

(54) DOUBLE INDUCTOR INTEGRATED POWER MODULE FOR HIGH CURRENT APPLICATIONS

(71) Applicant: Apple Inc., Cupertino, CA (US)

(72) Inventors: Sunil M. Akre, Santa Clara, CA (US); Kejiu Zhang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 472 days.

(21) Appl. No.: 16/551,334

(22) Filed: Aug. 26, 2019

(65) Prior Publication Data
US 2020/0296824 A1     Sep. 17, 2020

Related U.S. Application Data

(60) Provisional application No. 62/818,352, filed on Mar. 14, 2019.

(51) Int. Cl.
    *H05K 1/16*     (2006.01)
    *H05K 1/02*     (2006.01)
    (Continued)

(52) U.S. Cl.
    CPC .......... *H05K 1/0263* (2013.01); *H01F 27/24* (2013.01); *H01F 27/2804* (2013.01); *H01F 27/40* (2013.01); *H01F 41/041* (2013.01); *H05K 1/0203* (2013.01); *H05K 1/165* (2013.01); *H05K 1/185* (2013.01); *H05K 3/30* (2013.01); *H01F 2027/2809* (2013.01);
(Continued)

(58) Field of Classification Search
CPC .... H05K 1/0263; H05K 1/0203; H05K 1/165; H05K 1/185; H01F 27/40; H01F 27/24; H01F 27/2804; H01F 41/041

USPC .......................................................... 361/270
See application file for complete search history.

(56) References Cited

U.S. PATENT DOCUMENTS 7,876,191 B2 *    1/2011    Chandrasekaran ... H02M 3/158
                                                     336/212
8,344,842 B1 *    1/2013    Luzanov .................. H01F 41/02
                                                     336/192

(Continued)

OTHER PUBLICATIONS

Hou, Dongbin, "Very High Frequency Integrated POL for CPUs," Dissertation submitted to the Faculty of the Virginia Polytechnic Institute and State University in partial fulfillment of the requirements for the degree of Doctor of Philosophy in Electrical Engineering, Mar. 23, 2017, Blacksburg, Virginia, 180 pages.

*Primary Examiner* — Sherman Ng
(74) *Attorney, Agent, or Firm* — BakerHostetler (57) ABSTRACT

The disclosed technology relates to a power supply circuit that utilizes an integrated power module that has a first and second power converter disposed on opposite sides of an inductor core. The power supply circuit includes an inductor core comprising a plurality of nano-magnetic layers embedded within a printed circuit board, a first winding disposed on a first outer surface of the inductor core, a second winding disposed on a second outer surface of the inductor core, a first active layer disposed on an outer surface of the first winding, a second active layer disposed on an outer surface of the second winding, a first capacitor tile disposed on an outer surface of the first active layer, and a second capacitor tile disposed on an outer surface of the second active layer.

20 Claims, 4 Drawing Sheets

(51) Int. Cl.
*H05K 1/18* (2006.01)
*H01F 27/28* (2006.01)
*H01F 27/24* (2006.01)
*H01F 41/04* (2006.01)
*H05K 3/30* (2006.01)
*H01F 27/40* (2006.01)

(52) U.S. Cl.
CPC .................. *H05K 2201/066* (2013.01); *H05K 2201/10015* (2013.01); *H05K 2201/10053* (2013.01)

(56) References Cited

U.S. PATENT DOCUMENTS

2014/0218155 A1* 8/2014 Akre ...................... H05K 1/141
29/832
2017/0093300 A1* 3/2017 Akre ...................... H05K 1/165

* cited by examiner

FIG. 6

DOUBLE INDUCTOR INTEGRATED POWER MODULE FOR HIGH CURRENT APPLICATIONS

PRIORITY

This application claims the benefit under 35 U.S.C. § 119(e) of U.S. Provisional Patent Application Ser. No. 62/818,352, entitled "DOUBLE INDUCTOR INTEGRATED POWER MODULE FOR HIGH CURRENT APPLICATIONS," filed on Mar. 14, 2019, which is incorporated herein by reference in its entirety.

TECHNICAL FIELD

The present disclosure relates generally to power supplies, and more particularly, to a double inductor integrated power module for high-current applications.

BACKGROUND

Voltage regulators are used in a wide variety of circuits in order to provide a regulated output voltage to particular circuits. In high-current applications, voltage regulators may be implemented in a multi-phase architecture and in stages. Each of the stages may contribute to generating the output voltage based on supplied input voltage (e.g. from an external source). The stages may be coupled to one another, with capacitors coupled to the output of each stage. These capacitors may stabilize the voltage that is output by each of the stages. Generally, as certain applications may require higher current, a number of voltage regulators arranged on a printed circuit board or PCB may be increased. An increase in a number of voltage regulators, however, may result in increased acoustic noise, electromagnetic noise, and/or operating temperatures that impact user experience.

SUMMARY

The disclosed embodiments provide for a power-supply circuit that includes an inductor core that is formed of a plurality of nano-magnetic layers embedded within a printed circuit board (PCB). A first winding is disposed on a first outer surface of the inductor core and a second winding is disposed on a second outer surface of the inductor core. A first active layer is disposed on an outer surface of the first winding and electrically coupled to the inductor core. A second active layer is disposed on an outer surface of the second winding and electrically coupled to the inductor core. A first capacitor tile is disposed on an outer surface of the first active layer and electrically coupled to the first active layer. A second capacitor tile is disposed on an outer surface of the second active layer and electrically coupled to the second active layer. The first active layer, the first capacitor tile, the first winding and a portion of the inductor core form a first power converter. The second active layer, the second capacitor tile, the second winding and another portion of the inductor core form a second power converter.

The disclosed embodiments provide for an electronic device that uses a plurality of power modules for providing power to the electronic device. Each power module includes an inductor core that is formed of a plurality of nano-magnetic layers embedded within a PCB. A first winding is disposed on a first outer surface of the inductor core and a second winding is disposed on a second outer surface of the inductor core. A first active layer is disposed on an outer surface of the first winding and electrically coupled to the inductor core. A second active layer is disposed on an outer surface of the second winding and electrically coupled to the inductor core. A first capacitor tile is disposed on an outer surface of the first active layer and electrically coupled to the first active layer. A second capacitor tile is disposed on an outer surface of the second active layer and electrically coupled to the second active layer. The first active layer, the first capacitor tile, the first winding and a portion of the inductor core form a first power converter. The second active layer, the second capacitor tile, the second winding and another portion of the inductor core form a second power converter.

In some embodiments, a method for increasing a power density of a power-supply circuit is disclosed. The method includes embedding a plurality of nano-magnetic layers within a PCB to form an inductor core, disposing a first winding on a first outer surface of the inductor core, disposing a second winding on a second outer surface of the inductor core, connecting a first active layer disposed on an outer surface of the first winding to a first set of electrical connectors formed within the inductor core, connecting a second active layer disposed on an outer surface of the second winding to a second set of electrical connectors formed within the inductor core, connecting a first capacitor tile disposed on an outer surface of the first active layer to third set of electrical connectors formed within the first active layer, and connecting a second capacitor tile disposed on an outer surface of the second active layer to a fourth set of electrical connectors formed within the second active layer. The first active layer, the first capacitor tile, the first winding and a portion of the inductor core form a first power converter. The second active layer, the second capacitor tile, the second winding and another portion of the inductor core form a second power converter.

BRIEF DESCRIPTION OF THE DRAWINGS

The embodiments herein may be better understood by referring to the following description in conjunction with the accompanying drawings in which like reference numerals indicate identical or functionally similar elements. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

A conventional voltage regulator may generate 50-60 amperes (Amps) per phase. In applications requiring 300-400 Amps, voltage regulators may be arranged side-by-side on a printed circuit board or PCB in a 6-8 phase configuration. Arranging voltage regulators side-by-side, however, results in an increased footprint within devices. In applications requiring higher current, such as 600 Amps or more, increasing the number of voltage regulators arranged side-by-side on a surface of a PCB may not be possible due to limited physical space within electronic devices, and may further affect user experience via increases in acoustic noise, electromagnetic noise, and/or operating temperature.

The disclosed technology addresses the foregoing limitations of conventional power-supply circuits by integrating components of a voltage regulator on opposing sides of an inductor core to increase packaging efficiency while reducing or canceling acoustic noise and/or electromagnetic noise.

Figure 1:
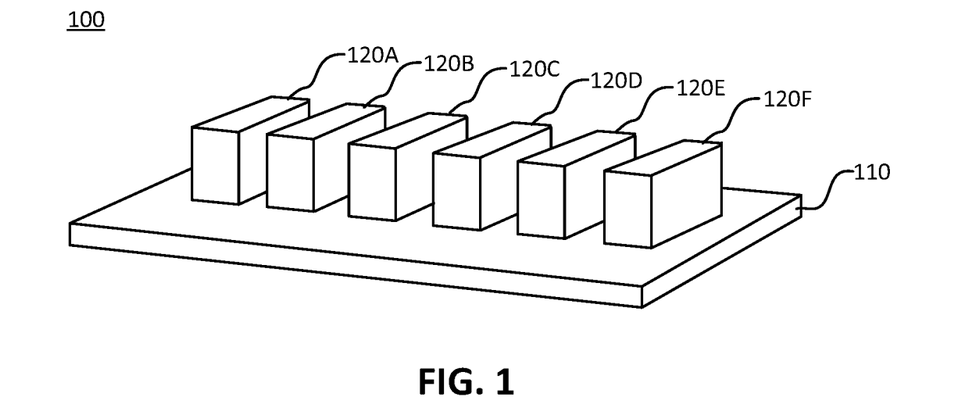
FIG. 1 illustrates a perspective view of a plurality of power modules, in accordance with various aspects of the subject technology.

FIG. 1 illustrates a perspective view of a power board 100, in accordance with various aspects of the subject technology. The power board 100 comprises a plurality of power modules 120A-F that are mounted to a PCB 110. Each power module 120A-F comprises a plurality of self-contained DC-DC power converters that are integrated onto a common inductor core to thereby increase a capacity of each power module 120A-F within the same footprint or physical space. Each power module 120A-F is configured to operate in very high frequencies, such as 5 MHz-10 MHz and may provide an output current of 100-120 Amps.

Figure 2:
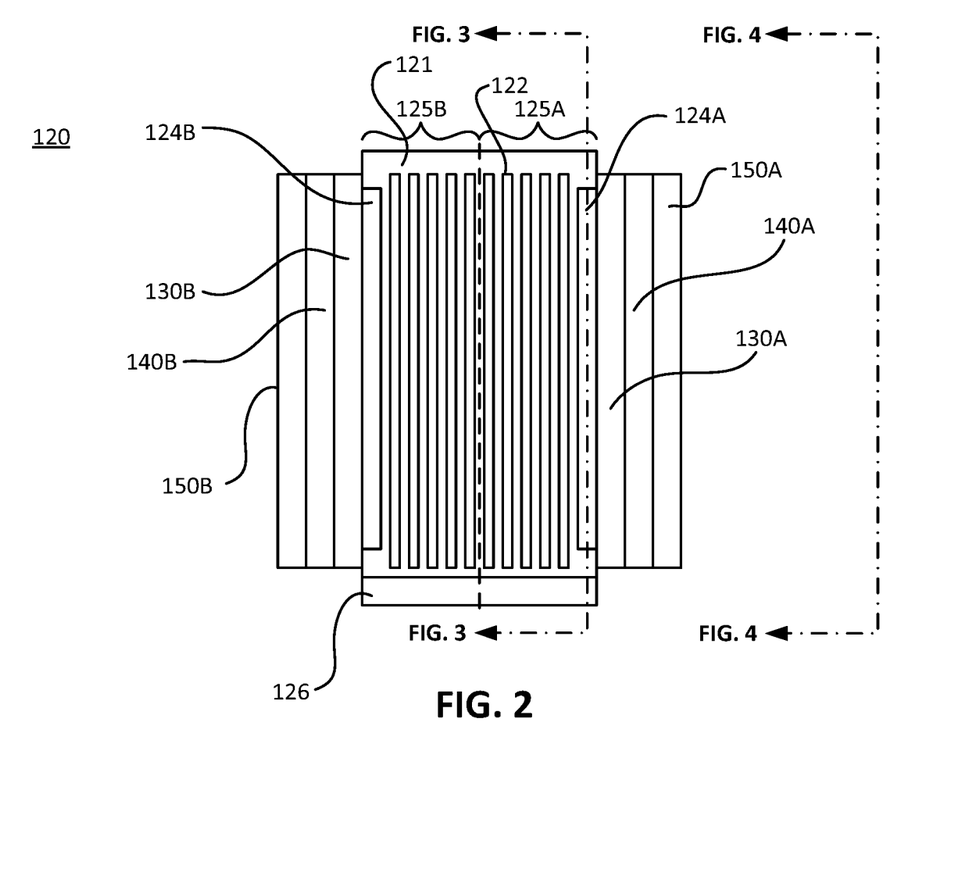
FIG. 2 illustrates a cross section view of a power module, in accordance with various aspects of the subject technology.

FIG. 2 illustrates a cross section view of a power module 120, in accordance with various aspects of the subject technology. Power module 120 (e.g., power module 120A-F of FIG. 1) comprises an inductor core 121, a first active layer 130A, a second active layer 130B, a first capacitor tile 140A, a second capacitor tile 140B, a first heat sink 150A and a second heat sink 150B. The inductor core 121 comprises a plurality of nano-magnetic layers 122 embedded within a PCB, a first winding 124A disposed on a first outer surface of the inductor core 121, and a second winding 124B disposed on a second outer surface of the inductor core 121 that is opposite the first outer surface of the inductor core 121.

Figure 3:
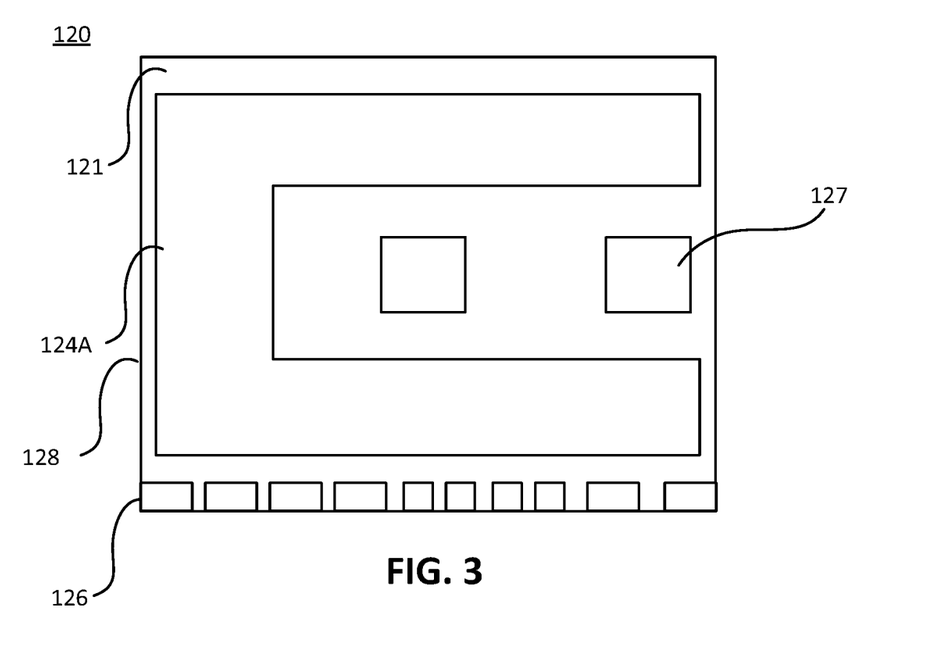
FIG. 3 illustrates a cross section view of a power module, in accordance with various aspects of the subject technology.

The first active layer 130A is disposed on an outer surface of the first winding 124A and is electrically coupled to the inductor core 121 via one or more electrical connectors 127 (as shown in FIG. 3). The second active layer 130B is disposed on an outer surface of the second winding 124B and is electrically coupled to the inductor core 121 via one or more electrical connectors. The first and second active layers, 130A and 130B respectively, may comprise control integrated circuits ("ICs"), such as a switch (e.g., MOSFET), a driver, and any other semiconductors. In some examples, the first active layer comprises a high-side MOSFET, and the second active layer comprises a low-side MOSFET to facilitate a power conversion in power module 120. Each of the first and second active layers, 130A and 130B respectively, has one or more electrical connectors disposed on an outer surface for facilitating an electrical connection to the first and second capacitor tiles, 140A and 140B respectively.

The first and second capacitor tiles, 140A and 140B respectively, may comprise input and output capacitors that are electrically connected to the first and active layers, 130A and 130B respectively, via the one or more electrical connectors. Specifically, the first capacitor tile 140A is disposed on an outer surface of the first active layer 130A and is electrically coupled to the first active layer 130A via the one or more electrical connectors. The second capacitor tile 140B is disposed on an outer surface of the second active layer 130B and is electrically coupled to the second active layer 130B via the one or more electrical connectors. In one aspect, each of the first and second capacitor tiles, 140A and 140B respectively, comprise a plurality of capacitors embedded within a PCB that are configured to offer input decoupling and output decoupling.

The first winding 124A and the second winding 124B may each comprise a plurality of isolated and parallel sheets of a conductive material, such as a copper, that are disposed on opposite sides of the inductor core 121. The first winding 124A and the second winding 124B may be constructed as a lamination to accommodate high frequencies (e.g., 5-10 MHz), versus a single conductor which in high frequencies, may be subject to a "skin" effect where electrons travel along the surface area of the conductor rather than through the entire cross section, thereby contributing to losses. The first winding 124A and the second winding 124B may comprise a plurality of isolated sheets of copper, each having a thickness of "skin" depth.

In one aspect, the first winding 124A and the second winding 124B may each have an asymmetrical shape, such as an "L" shape, "C" shape, any other shape that is not symmetrical about an axis, may include at least one turn, or may include more than one turn. In some aspects, the shape of the second winding 124B may be mirrored to the shape or pattern of the first winding 124A. In some aspects, because the winding pattern of the second winding 124B is mirrored to the winding pattern of the first winding 124A, any electromagnetic noise is canceled because each winding is carrying the same amount of current, but in opposite directions, thereby resulting in their respective moments cancelling each other.

In one aspect, the first active layer 130A, the first capacitor tile 140A, the first winding 124A and a first portion 125A of the inductor core 121 comprise a first power converter. In another aspect, the second active layer 130B, the second capacitor tile 140B, the second winding 124B and a second portion 125B of the inductor core 121 comprise a second power converter. Each power module 120 represents two power convertors running anti-parallel. The first convertor on one side of the inductor core 121, and the second power converter on the other, opposite, side of the inductor core 121. Accordingly, within the same volume of the inductor core 121, the current can be doubled.

In one aspect, each of the first winding 124A and the second winding 124B establishes a magnetic flux in the inductor core 121. Because the current is equal in magnitude and opposite in direction, the magnetic flux established by each winding is cancelled inside the inductor core 121. In other aspects, because there are two windings 124A, B utilizing a single inductor core 121, any acoustic noise or vibrations generated by the first winding 124A is canceled by the second winding 124B because each winding has current flowing in opposing directions and thus, at each level they see the same and opposite current thereby canceling any effect.

In some aspects, because the power module 120 is configured to operate in very high frequencies (e.g., 5-10 MHz), a conventional solid inductor core would not be beneficial because it would result in too much eddy current losses. As described above, the inductor core 121 of the subject technology comprises thin or laminate sheets of magnetic material, with each sheet isolated from an adjacent sheet. The magnetic material may comprise nano-magnetic composite materials which have very low losses at very high frequencies. With conventional inductors, as a switching frequency is increased, core losses increase. In contrast, because the inductor core 121 of the subject technology comprises nano-magnetic composite material and the granular size is smaller than their magnetic domains, domain wall magnetic moment (which causes more losses when compared to magnetic spin moment) is no longer a significant contributor to losses. In one aspect, the power module 120 may further comprise a transformer to provide an isolated power converter.

FIG. 3 illustrates a cross section view of the power module 120, in accordance with various aspects of the subject technology. The first winding 124A is shown with a "C" shape pattern having two turns in the winding, with a vertical portion disposed proximal to a first side 128 of the inductor core 121. In this example, the second winding 124B may comprise a mirrored "C" shape with a vertical portion disposed proximal to the first side 128.

As discussed above, the inductor core 121 includes one or more electrical connectors 127 disposed proximal to the first winding 124A and the second winding 124B (not shown) for electrically coupling to the first active layer 130A and the second active layer 130B, respectively. The inductor core 121 also comprises a plurality of terminals 126 disposed along an outer surface proximal to the PCB 110 (as shown in FIG. 1) to facilitate electrical connection between the PCB 110 and the power module 120. The plurality of terminals 126 may comprise power and/or control terminals for taking the signal and power into and out of the power module 120.

Figure 4:
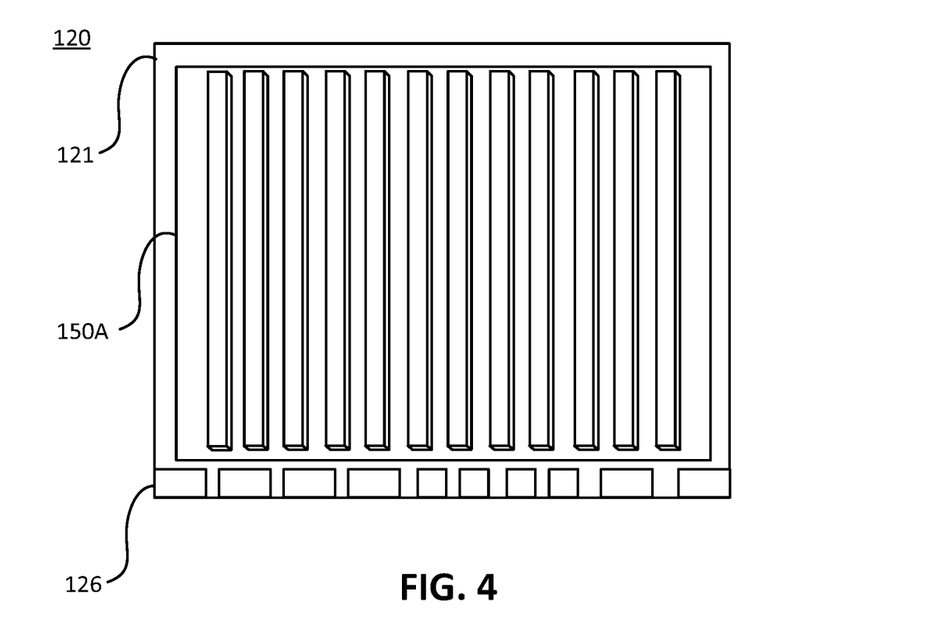
FIG. 4 illustrates a side view of a power module, in accordance with various aspects of the subject technology.

FIG. 4 illustrates a side view of the power module 120, in accordance with various aspects of the subject technology. The first heat sink 150A may be disposed on an outer surface of the first capacitor tile 140A and the second heat sink 150B may be disposed on an outer surface of the second capacitor tile 140B. The first and second heat sinks, 150A and 150B respectively, may each be formed of a heat conducting material, such as a metal alloy, that is configured to transfer heat away from the inductor core 121, the first active layer 130A, the second active layer 130B, the first capacitor tile 140A, and the second capacitor tile 140B, and into the air. In one aspect, the first and second heat sinks, 150A and 150B respectively, may each comprise a plurality of fins to increase dissipation of heat transferred from the power module 120.

Figure 5:
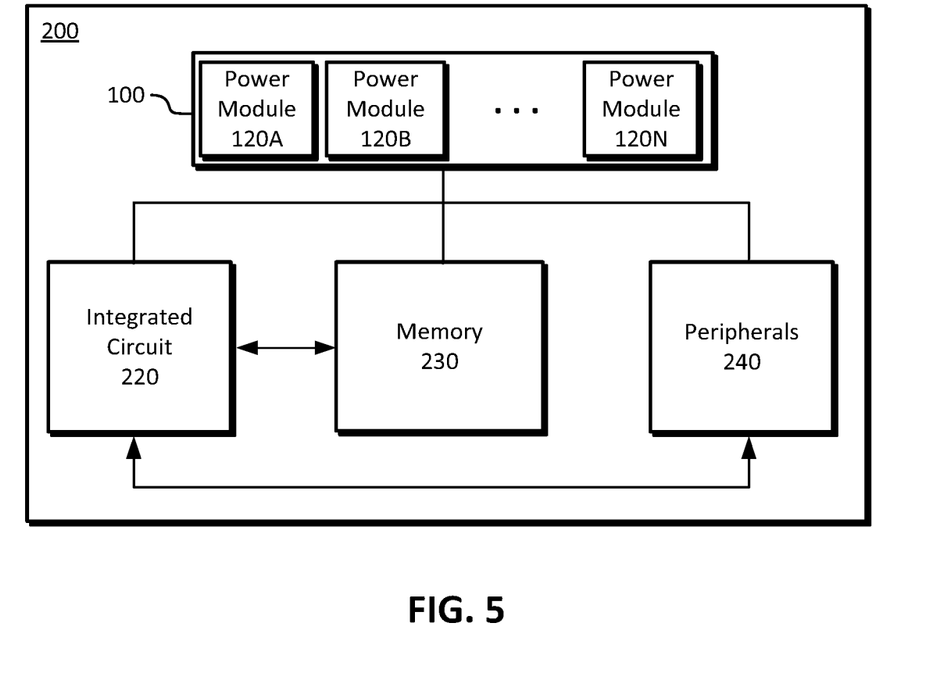
FIG. 5 illustrates a block diagram of an electronic device that includes a power board, in accordance with various aspects of the subject technology.

FIG. 5 illustrates a block diagram of an electronic device 200 that includes a power board 100, in accordance with various aspects of the subject technology. The electronic device 200 includes at least one instance of an integrated circuit 220 coupled to external memory 230. The integrated circuit 220 may include a memory controller that is coupled to the external memory 230. The integrated circuit 220 is coupled to one or more peripherals 240 and the external memory 230. The power board 100 is also provided which supplies the supply voltages to the integrated circuit 220 as well as one or more supply voltages to the memory 230 and/or the peripherals 240. In some embodiments, more than one instance of the integrated circuit 220 may be included (and more than one external memory 230 may be included as well).

The power board 100 comprises a plurality of power modules 120A-N (as described above) that are arranged within the electronic device 200 to support the power demands of the electronic device 200, components, and/or peripherals 240. Based on the power requirements of the electronic device 200, a number of power modules 120A-N utilized by the electronic device 200 may be increased to satisfy the power requirements of the electronic device. Specifically, should the electronic device 200 require more than 600 Amps peak current for a graphics processing unit (GPU) or a central processing unit (CPU), eight power modules 120A-N may be arranged within the electronic device to provide 800-880 Amps. In some aspects, integrating power converters onto an inductor core, as described above, the power board 100 is capable of providing high-current within a smaller footprint over conventional power supplies (which arrange components side-by-side), while reducing or eliminating electromagnetic noise and/or acoustic noise through cancellation (as described above). In another aspect, each of the plurality of power modules 120A-N, during operation, provide current at a common target output voltage to a load.

The peripherals 240 may include any desired circuitry, depending on the type of electronic device 200. For example, in one embodiment, the electronic device 200 may be a mobile device (e.g. personal digital assistant (PDA), tablet, laptop, smart phone, etc.) and the peripherals 240 may include devices for various types of wireless communication, such as WiFi, Bluetooth, cellular, global positioning system, etc. The peripherals 240 may also include additional storage, including RAM storage, solid-state storage, or disk storage. The peripherals 240 may include user interface devices such as a display screen, including touch display screens or multitouch display screens, keyboard or other input devices, microphones, speakers, etc. In other embodiments, the electronic device 200 may be any type of computing system (e.g. desktop personal computer, workstation, watch, wearable device, and/or other type of computing system).

The external memory 230 may include any type of memory. For example, the external memory 230 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 230 may include one or more memory modules to which the memory devices are mounted, such as single inline memory modules (SIMMs), dual inline memory modules (DIMMs), etc.

Figure 6:
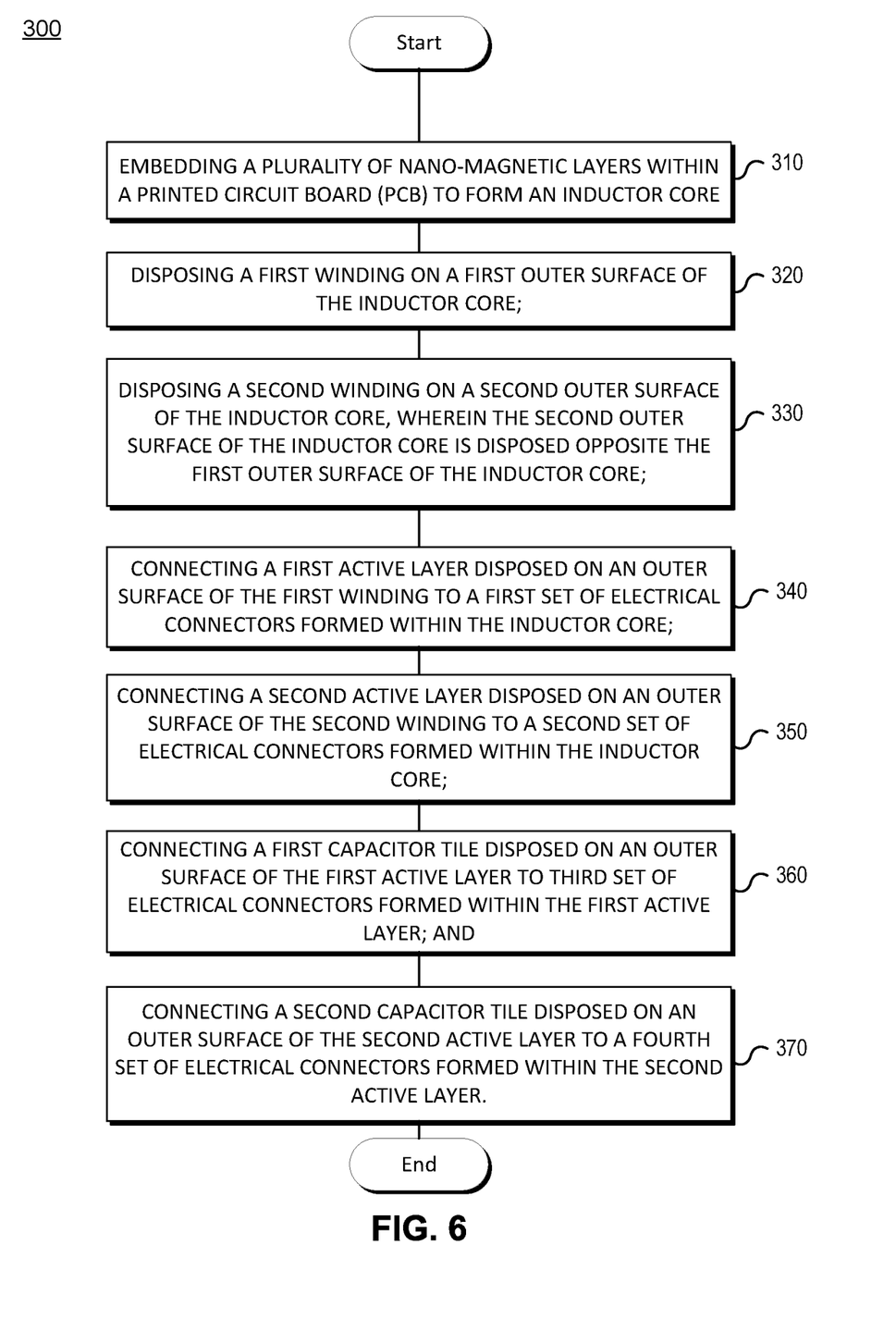
FIG. 6 illustrates an exemplary method for increasing a power density of a power-supply circuit, in accordance with various aspects of the subject technology.

FIG. 6 illustrates an exemplary method 300 for increasing a power density of a power-supply circuit, in accordance with various aspects of the subject technology. It should be understood that, for any process discussed herein, there can be additional, fewer, or alternative steps performed in similar or alternative orders, or in parallel, within the scope of the various embodiments unless otherwise stated.

At operation 310, a plurality of nano-magnetic layers are embedded within a PCB to form an inductor core. At operation 320, a first winding is disposed on a first outer surface of the inductor core and at operation 330, a second winding is disposed on a second outer surface of the inductor core. The second outer surface of the inductor core is disposed opposite the first outer surface of the inductor core. At operation 340, a first active layer is disposed on an outer surface of the first winding and is connected to a first set of electrical connectors formed within the inductor core. At operation 350, a second active layer is disposed on an outer surface of the second winding and is connected to a second set of electrical connectors formed within the inductor core. At operation 360, a first capacitor tile is disposed on an outer surface of the first active layer and connected to third set of electrical connectors formed within the first active layer. At operation 370, a second capacitor tile is disposed on an outer surface of the second active layer and is connected to a fourth set of electrical connectors formed within the second active layer. The first active layer, the first capacitor tile, the first winding and a portion of the inductor core comprise a first power converter. The second active layer, the second capacitor tile, the second winding and another portion of the inductor core comprise a second power converter. Accordingly, within the same volume of the inductor core, the current can be doubled. A first heat sink may be disposed on an outer surface of the first capacitor tile. A second heat sink may be disposed on an outer surface of the second capacitor tile. In one aspect, the power-supply circuit may further comprise a transformer to provide an isolated power converter.

In one aspect, each of the first winding and the second winding establishes a magnetic flux in the inductor core. Because the current is equal in magnitude and opposite in direction, the magnetic flux established by each winding is cancelled inside the inductor core. In other aspects, because there are two windings utilizing a single inductor core, any acoustic noise or vibrations generated by the first winding is canceled by the second winding because each winding has current flowing in opposing directions and thus, at each level they see the same and opposite current thereby canceling any effect.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A power-supply circuit, comprising:
   an inductor core comprising a plurality of nano-magnetic layers embedded within a printed circuit board (PCB);
   a first winding disposed on a first outer surface of the inductor core;
   a second winding disposed on a second outer surface of the inductor core, wherein the second outer surface of the inductor core is disposed opposite the first outer surface of the inductor core;
   a first active layer disposed on an outer surface of the first winding and electrically coupled to the inductor core;
   a second active layer disposed on an outer surface of the second winding and electrically coupled to the inductor core;
   a first capacitor tile disposed on an outer surface of the first active layer and electrically coupled to the first active layer;
   a second capacitor tile disposed on an outer surface of the second active layer and electrically coupled to the second active layer;
   wherein the first active layer, the first capacitor tile, the first winding and a portion of the inductor core comprise a first power converter; and
   wherein the second active layer, the second capacitor tile, the second winding and another portion of the inductor core comprise a second power converter.

2. The power-supply circuit of claim 1, further comprising:
   a first heat sink disposed on an outer surface of the first capacitor tile; and
   a second heat sink disposed on an outer surface of the second capacitor tile.

3. The power-supply circuit of claim 1, wherein each of the first winding and the second winding comprise a plurality of isolated and parallel sheets of a conductive material.

4. The power-supply circuit of claim 1, wherein each of the first winding and the second winding comprise at least one turn, wherein a pattern of the second winding is a mirror of a pattern of the first winding.

5. The power-supply circuit of claim 1, wherein each of the first winding and the second winding comprise connectors disposed on an outer surface thereof for electrically connecting the first active layer and the second active layer, respectively.

6. The power-supply circuit of claim 1, wherein each of the first active layer and the second active layer comprise a switch.

7. The power-supply circuit of claim 1, wherein each of the first active layer and the second active layer comprise connectors disposed on an outer surface thereof for electrically connecting the first capacitor tile and the second capacitor tile, respectively.

8. The power-supply circuit of claim 1, wherein each of the first capacitor tile and the second capacitor tile comprise a plurality of capacitors embedded within a PCB.

9. The power-supply circuit of claim 1, wherein the inductor core further comprises a plurality of terminals disposed along a third outer surface of the inductor core.

10. An electronic device, comprising a plurality of power modules, each power module comprising:
    an inductor core comprising a plurality of nano-magnetic layers embedded within a printed circuit board (PCB);
    a first winding disposed on a first outer surface of the inductor core;
    a second winding disposed on a second outer surface of the inductor core, wherein the second outer surface of the inductor core is disposed opposite the first outer surface of the inductor core;
    a first active layer disposed on an outer surface of the first winding and electrically coupled to the inductor core;
    a second active layer disposed on an outer surface of the second winding and electrically coupled to the inductor core;
    a first capacitor tile disposed on an outer surface of the first active layer and electrically coupled to the first active layer;
    a second capacitor tile disposed on an outer surface of the second active layer and electrically coupled to the second active layer;
    wherein the first active layer, the first capacitor tile, the first winding and a portion of the inductor core comprise a first power converter; and
    wherein the second active layer, the second capacitor tile, the second winding and another portion of the inductor core comprise a second power converter.

11. The electronic device of claim 10, wherein each power module further comprises:

a first heat sink disposed on an outer surface of the first capacitor tile; and a second heat sink disposed on an outer surface of the second capacitor tile.

12. The electronic device of claim 10, wherein each of the first winding and the second winding comprise a plurality of isolated and parallel sheets of a conductive material.

13. The electronic device of claim 10, wherein each of the first winding and the second winding comprise at least one turn, wherein a pattern of the second winding is a mirror of a pattern of the first winding.

14. The electronic device of claim 10, wherein each of the first active layer and the second active layer comprise a switch.

15. The electronic device of claim 10, wherein each of the first capacitor tile and the second capacitor tile comprise a plurality of capacitors embedded within a PCB.

16. A method for increasing a power density of a power-supply circuit, the method comprising:

embedding a plurality of nano-magnetic layers within a printed circuit board (PCB) to form an inductor core;

disposing a first winding on a first outer surface of the inductor core;

disposing a second winding on a second outer surface of the inductor core, wherein the second outer surface of the inductor core is disposed opposite the first outer surface of the inductor core;

connecting a first active layer disposed on an outer surface of the first winding to a first set of electrical connectors formed within the inductor core;

connecting a second active layer disposed on an outer surface of the second winding to a second set of electrical connectors formed within the inductor core;

connecting a first capacitor tile disposed on an outer surface of the first active layer to third set of electrical connectors formed within the first active layer;

connecting a second capacitor tile disposed on an outer surface of the second active layer to a fourth set of electrical connectors formed within the second active layer;

wherein the first active layer, the first capacitor tile, the first winding and a portion of the inductor core comprise a first power converter; and wherein the second active layer, the second capacitor tile, the second winding and another portion of the inductor core comprise a second power converter.

17. The method of claim 16, further comprising:

mounting a first heat sink disposed on an outer surface of the first capacitor tile; and mounting a second heat sink disposed on an outer surface of the second capacitor tile.

18. The method of claim 16, wherein each of the first winding and the second winding comprise a plurality of isolated and parallel sheets of a conductive material.

19. The method of claim 16, wherein each of the first winding and the second winding comprise at least one turn, wherein a pattern of the second winding is a mirror of a pattern of the first winding.

20. The method of claim 16, wherein each of the first active layer and the second active layer comprise a switch.

* * * * *